US006939149B2

(12) United States Patent
Goodsell et al.

(10) Patent No.: US 6,939,149 B2
(45) Date of Patent: Sep. 6, 2005

(54) ELECTRICAL DEVICE WITH MECHANISM TO PREVENT SEPARATION OF THE ELECTRICAL RECEPTACLE HOUSING

(75) Inventors: John P. Goodsell, Stratford, CT (US); Nelson Bonilla, West Haven, CT (US); Peter A. Czerner, Monroe, CT (US)

(73) Assignee: Hubbell Incorporated, Orange, CT (US)

( * ) Notice: Subject to any disclaimer, the term of this patent is extended or adjusted under 35 U.S.C. 154(b) by 0 days.

(21) Appl. No.: 10/144,764

(22) Filed: May 15, 2002

(65) Prior Publication Data

US 2003/0216079 A1 Nov. 20, 2003

(51) Int. Cl.[7] ........................ H01R 4/66; H01R 13/648; H01R 11/01; H01R 4/30; H05K 5/02

(52) U.S. Cl. ........................ 439/107; 439/801; 439/782; 174/51

(58) Field of Search ................................ 439/812, 813, 439/810, 811, 701, 721; 200/51 R; 174/51

(56) References Cited

U.S. PATENT DOCUMENTS

| | | | | |
|---|---|---|---|---|
| 1,438,751 A | | 12/1922 | Isles | |
| 1,773,572 A | | 8/1930 | Calderwood | |
| 2,285,928 A | | 6/1942 | Jensen | |
| 2,687,517 A | | 8/1954 | Despard | 339/263 |
| 3,029,405 A | | 4/1962 | Buchanan | 339/14 |
| 3,344,394 A | | 9/1967 | Kingsbury et al. | 339/272 |
| 3,384,393 A | | 5/1968 | Horton et al. | 285/158 |
| 3,674,790 A | * | 7/1972 | Wolf et al. | 546/81 |
| 3,783,321 A | | 1/1974 | Patterson | 317/101 |
| 4,021,604 A | | 5/1977 | Dola et al. | 174/51 |
| 4,045,637 A | | 8/1977 | Mongeau | 200/303 |
| 4,090,762 A | | 5/1978 | Hoffman | 339/95 |
| 4,223,178 A | | 9/1980 | Lass | 174/65 |
| 4,422,701 A | * | 12/1983 | Anderson | 439/107 |
| 5,021,610 A | | 6/1991 | Roberts | 174/65 |
| 5,043,536 A | | 8/1991 | DeBartolo, Jr. | 174/65 |
| 5,206,789 A | | 4/1993 | Barbry | 361/355 |
| 5,216,203 A | | 6/1993 | Gower | 174/65 |
| 5,741,161 A | * | 4/1998 | Cahaly et al. | 439/709 |
| 5,906,272 A | * | 5/1999 | Kurek | 200/559 |
| 5,998,734 A | | 12/1999 | Kerestan et al. | 174/53 |
| 6,102,750 A | * | 8/2000 | Little et al. | 439/813 |
| 6,176,747 B1 | * | 1/2001 | Rowe et al. | 439/721 |
| 6,188,020 B1 | | 2/2001 | Osterbrock et al. | 174/51 |
| 6,206,737 B1 | * | 3/2001 | Bonilla et al. | 439/801 |
| 6,293,812 B1 | | 9/2001 | Ewer et al. | 439/107 |

* cited by examiner

*Primary Examiner*—Chandrika Prasad
(74) *Attorney, Agent, or Firm*—Alfred N. Goodman; Mark S. Bicks; Garrett V. Davis

(57) ABSTRACT

An electrical receptacle, which includes a first housing portion and a second housing portion coupled to the first housing portion. An electrical device is positioned between the first and second housing portions. The terminal has a base and a first protrusion and a second protrusion extending transverse to the base. The first and second protrusions are on opposite sides of the terminal. A clamp is located adjacent to the terminal and positioned between the first and second protrusions and is adapted to couple an electrical wire to the terminal. A fastening device extends through the clamp and is adapted to rotate relative to the terminal. When rotated, the clamp engages at least one of the first and second protrusions on the terminal to limit rotation of the clamp relative to the terminal, thereby preventing separation of the housing.

26 Claims, 8 Drawing Sheets

ELECTRICAL DEVICE WITH MECHANISM TO PREVENT SEPARATION OF THE ELECTRICAL RECEPTACLE HOUSING

FIELD OF THE INVENTION

The present invention relates to an electrical device that has terminals that limit the internal wiring clamps from turning and therefore prevent separation of the housing. More particularly, the present invention relates to an electrical device that has two wings or protrusions extending from each terminal that limit the internal clamp from rotating and contacting a portion of the housing and forcing the front and the back of the housing to separate and thereby adversely effect the performance of the housing.

BACKGROUND OF THE INVENTION

A widely used terminal for connecting a wire or conductor is the so-called "backwired type", as seen in FIGS. 1 and 2. The backwired terminal 100 includes, essentially, a screw 102, a current carrying terminal plate 104, and a clamping nut 106. In many such backwired terminals, the terminal plate has a clearance opening to receive the screw, and the screw is threaded into the clamping nut to draw the clamping nut toward the terminal plate when the screw is tightened. In the conventional backwired terminal, the electrical connection is made by inserting the stripped end of an insulation jacketed conductor 108 between the clamping nut and the terminal plate and then tightening the screw to compress the conductor between the clamping nut and the plate. Such backwired terminals are quite popular because of the ease of connecting a conductor to the terminal, and because the terminal assembly can be surrounded with electrically insulating barriers or a housing 110.

Since it is preferable to have the backwire terminals surrounded with electrically insulating barriers, the terminals are generally accessible through the housing by a relatively small rectangular opening therein. The opening is preferably not much larger than the clamping nut. To couple the clamping nut to the terminal, the clamping nut is placed overlying the terminal in the opening immediately adjacent the walls of the housing. Therefore, when the screw is tightened to compress the conductor between the clamping nut and the plate, the clamping nut generally rotates in the direction of the screw due to frictional forces, as shown in FIG. 2.

When the clamping nut rotates, an edge of the clamping nut contacts the wall of the housing, causing a portion, or upwardly extending wall, of the bottom of the housing to be pushed or bow outwardly. This outward movement generally is greatest at the portion of the wall distal from the bottom surface of the housing. In other words, the upwardly extending wall pivots around the portion of the wall proximal to the bottom surface of the housing. This pivoting motion forces the upper portion of the housing away from the lower portion of the housing and creates a gap 112 between the two housing portions adjacent the two clamping nuts.

The gap, or separation, between the two housing portions can adversely affect the performance of the electrical device by allowing the terminal plates 104 to separate and move out of position. If the terminal plates move out of position, the electrical contacts supported by the terminal plates may not line up or make proper contact with each other, causing failure of the electrical device when the device is closed to complete the electrical circuit.

Thus, a need exists to provide an improved electrical device that has terminal plates that limit the internal wiring clamps from turning and therefore prevent separation of the housing.

SUMMARY OF THE INVENTION

Accordingly it is an object of the present invention to provide an improved backwire terminal for an electrical device.

It is another object of the present invention to provide an electrical device that has a backwire terminal that prevents separation of the housing portions.

It is still another object of the present invention to provide an electrical device that has a backwire terminal with protrusions or wings thereon that limit a clamping nut from rotating and contacting the housing.

It is yet another object of the present invention to provide an electrical device that has a backwire terminal that prevents adverse performance of the electrical device by preventing separation of the housing portions.

The foregoing objects are basically attained by providing an electrical receptacle comprising a first housing portion and a second housing portion coupled to the first housing portion. An electrical device is positioned between the first and second housing portions. A terminal is electrically connected to the electrical device, and has a base and a first protrusion and a second protrusion extending transverse to the base. The first and second protrusions are on opposite sides of the terminal. A clamp is located adjacent to the terminal and positioned between the first and second protrusions and is adapted to couple an electrical wire to the terminal. A fastening device extends through the clamp and is adapted to rotate relative to the terminal. The clamp engages at least one of the first and second protrusions on the terminal to prevent rotation of the clamp relative to the terminal.

Other objects, advantages, and salient features of the present invention will become apparent to those skilled in the art from the following detailed description, which, when taken in conjunction with the annexed drawings, discloses a preferred embodiment of the invention.

DETAILED DESCRIPTION OF THE INVENTION

Figure 1:
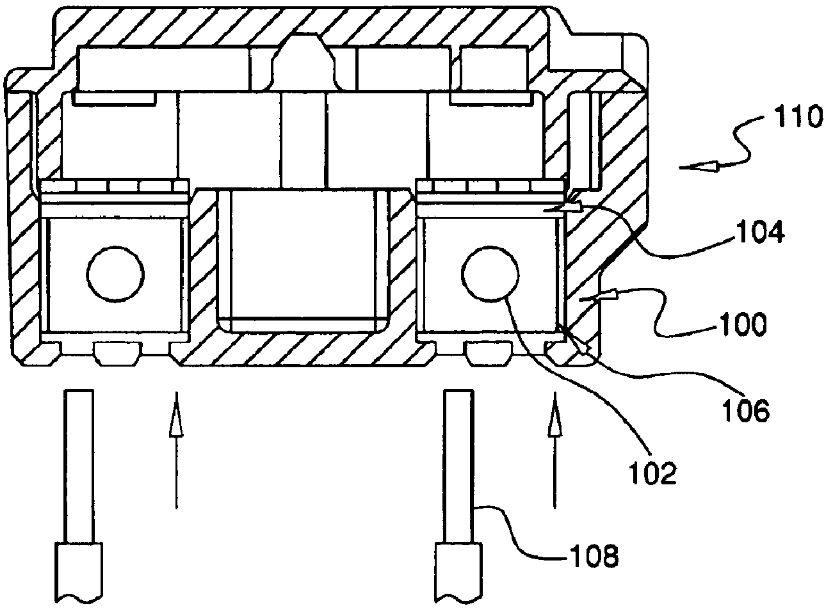
FIG. 1 PRIOR ART
FIG. 1 is side view in section of a prior art electrical device with a conventional backwire terminal.
Figure 2:
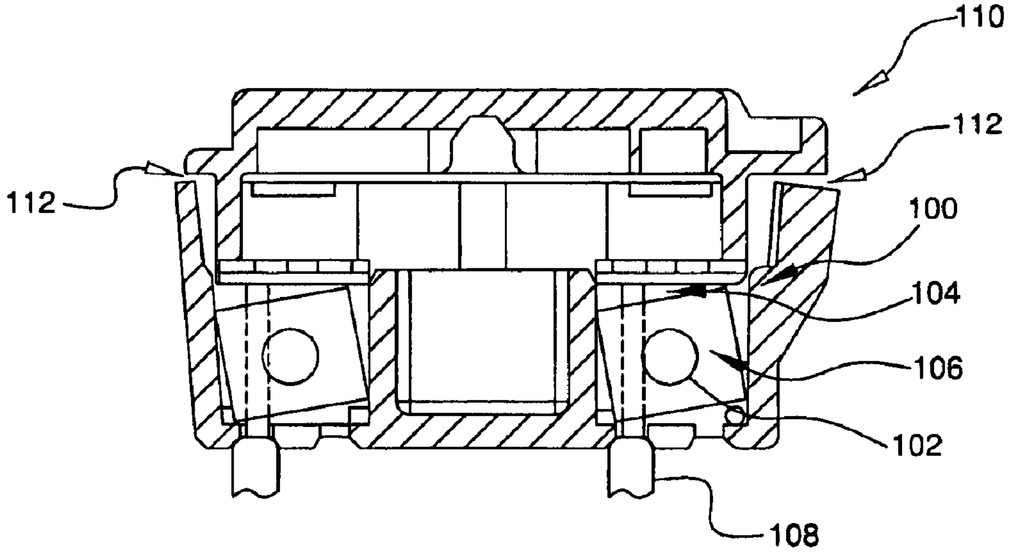
FIG. 2 PRIOR ART
FIG. 2 is a side view in section of the prior art electrical device of FIG. 1 with the clamping nut rotating with the screw, causing separation of the two housing portions.
Figure 3:
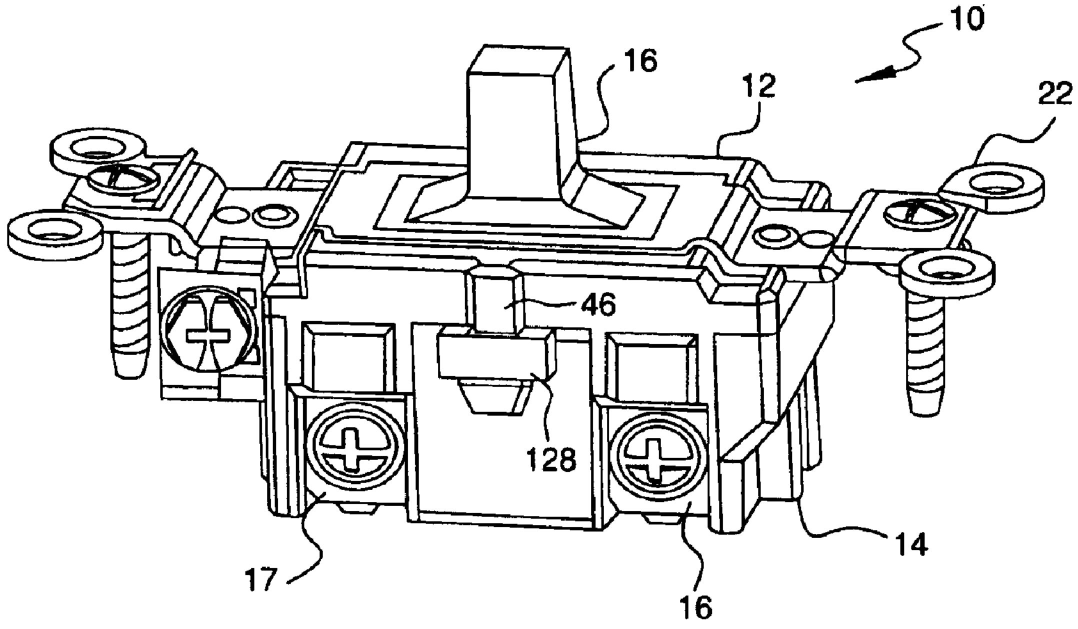
FIG. 3 is a perspective top view of an electric device according the preferred embodiment of the present invention.
Figure 4:
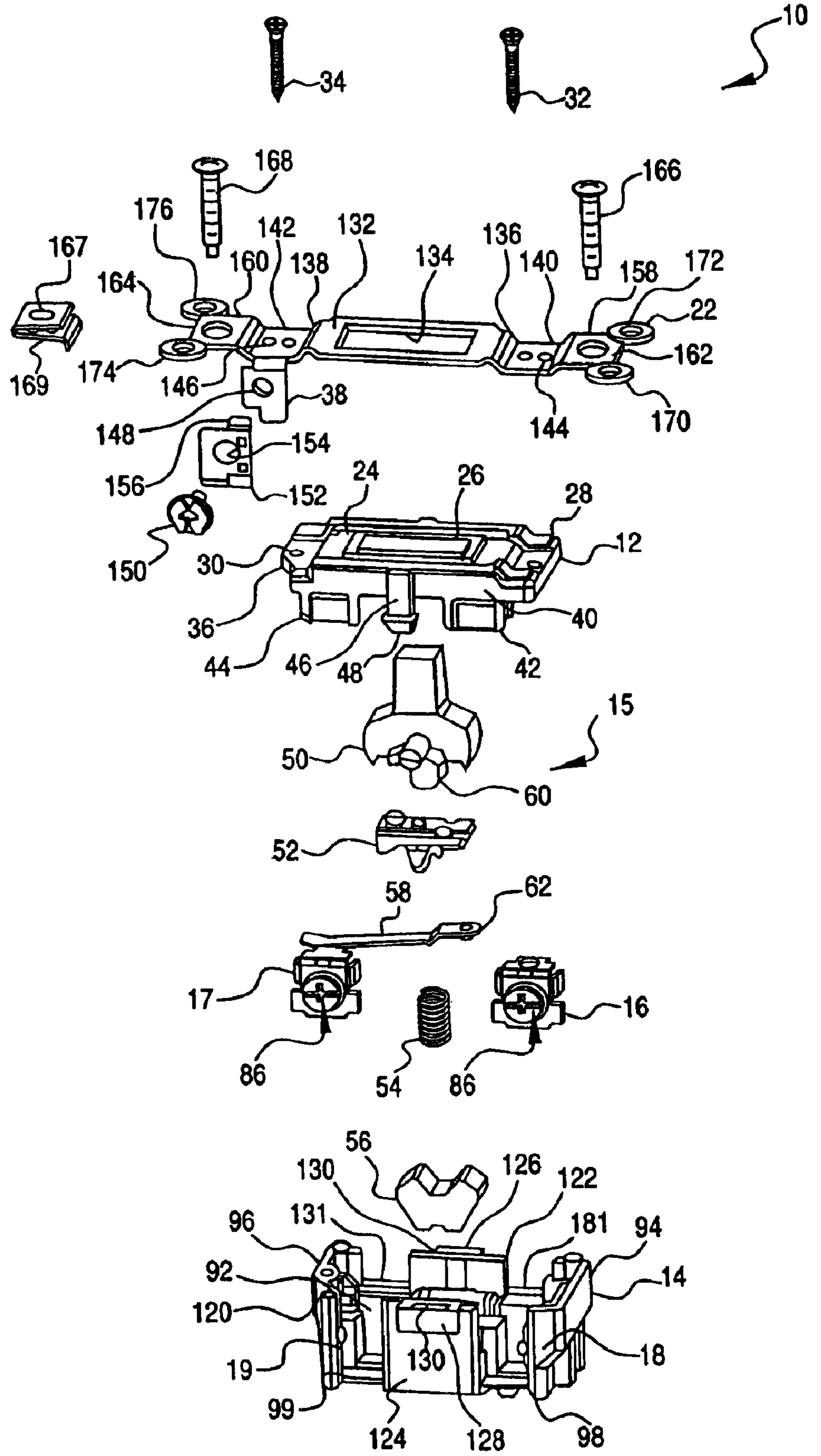
FIG. 4 is an exploded perspective top view of the electrical device of FIG. 3.
Figure 5:
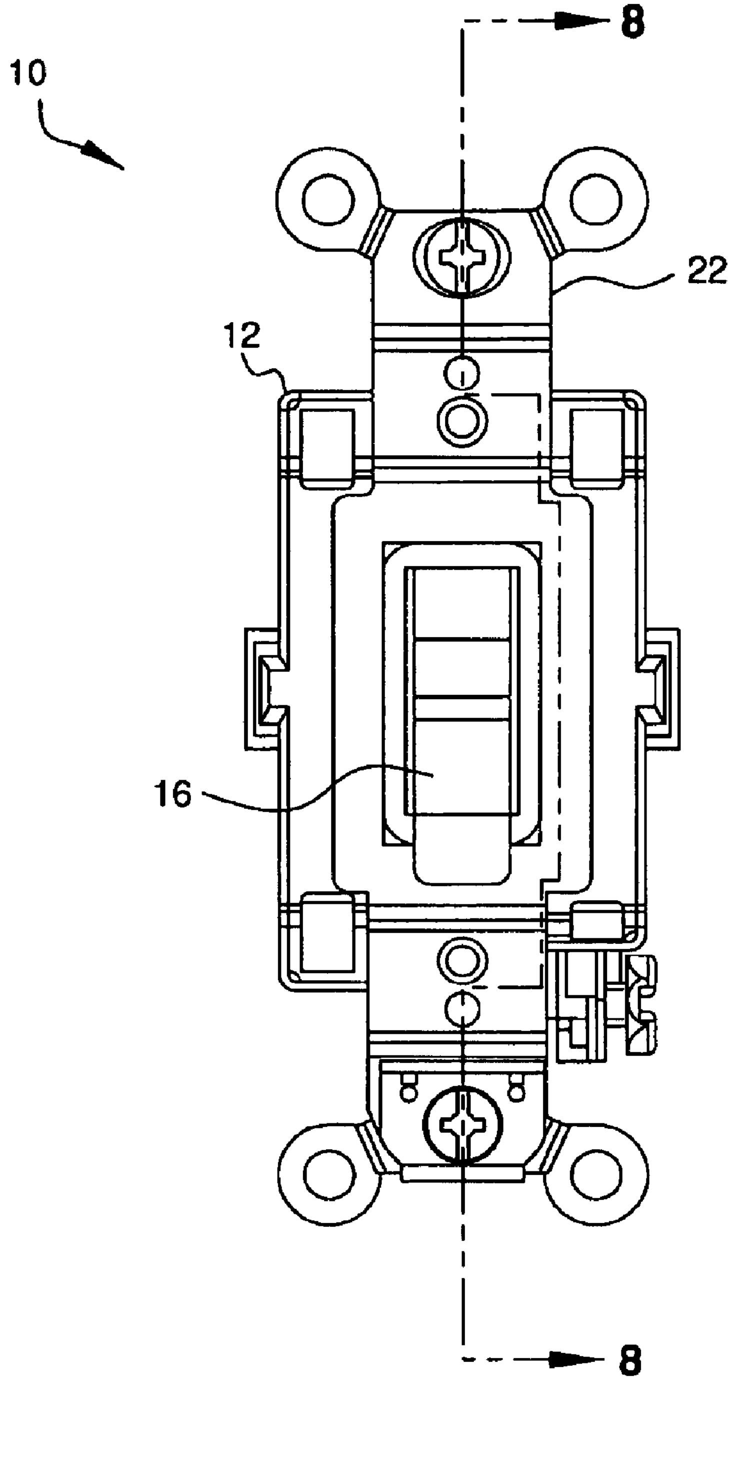
FIG. 5 is a top plan view of the electrical device of FIG. 3.

As shown in FIGS. 3–5, the present invention is preferably an electrical assembly 10 that is encased between an upper housing portion 12 and a lower housing portion 14. The upper and lower housing portions couple together and hold an electrical device 15 therein, allowing the backwire or contact terminals 16 and 17 to be exposed through openings 18 and 19, respectively, in the side of the housing. A grounding plate or yoke 22 is coupled to the upper housing portion and allows the electrical assembly to be properly grounded.

Figure 9:
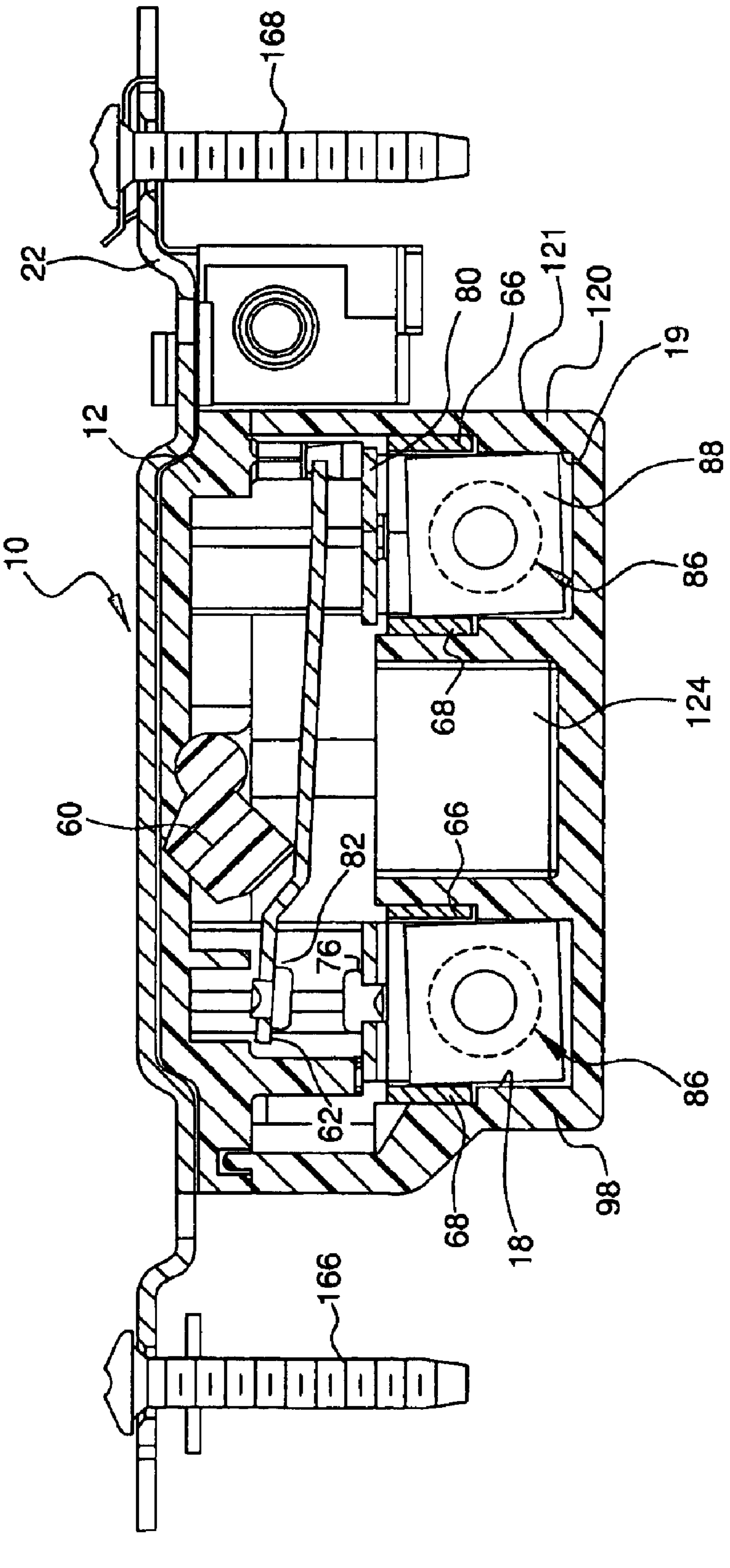
FIG. 9 is an elevational side view in section of the electrical device of FIG. 8, showing the clamping nuts tightened but only slightly rotated relative to the backwire terminals and not contacting the housing, thereby preventing separation between the top portion and the bottom portion of the housing.

As shown in FIG. 9, wings 66 and 68 extend inwardly from terminals 16 and 17. A clamping nut 88 is positioned between wings 66 and 68 and is adapted to couple an electrical wiring to the terminals using screw 86. When screw 86 is rotated to tighten nut 88 against a respective terminal, the nut rotates slightly, and contacts wings 66 or 68. The wings prevent the nut from further rotation and thereby prevent the nut from contacting the housing portion 12 or 14. The wings therefore prevent separation of the housing portions from each other and help to keep the terminals properly positioned with the housing portions.

As seen in FIG. 4, upper housing portion 12 is preferably substantially rectangular and formed of plastic or any other nonconductive material, but may be formed of any suitable material. Housing portion 12 has a first surface or front face 24 that has a substantially rectangular aperture or opening 26 therein. Surface 24 has two substantially rectangular depressed or recessed portions 28 and 30 at the opposite ends of surface 24. Each recessed portion 28 and 30 has an aperture therein for receiving a threaded fastener or screw 32 and 34, respectively, and coupling yoke 22 to housing portion 12. Portion 30 additionally has a notch 36 along one edge that allows for placement of the grounding tab 38.

Wall or side surface 40 extends substantially perpendicular to surface 24 substantially around the entire periphery of surface 24. Two substantially rectangular protrusions or walls 42 and 44 extend from surface 40 on each side of the housing portion 12 away from surface 24. A post 46 having a barb 48 extends from each side of the housing portion 12 and each post is unitarily attached to the surface of wall 40 and extends away from surface 40 and couples housing portion 12 to the housing portion 14.

Electrical device, or more preferably AC switch, 15 is preferably a switch that is known in the art and includes a toggle handle 50, a toggle insert 52, backwire or contact terminal 16, backwire or brush terminal 17, rocker spring 54 and rocker 56. As is known in the art, toggle handle 50 can generally be moved into a first or open position and a second or closed position. In the open position, spring 54 biases arm 58 of contact 17 upwardly or away from terminal 16, thereby preventing electricity from passing from terminal 16 to terminal 17. When the switch 15 is moved to the closed position, protrusion 60 overcomes the bias of spring 54 and moves or forces the end 62 of arm 58 into contact with terminal 16, thereby completing the electrical circuit and allowing electricity to flow from terminal 16 to terminal 17. It is noted that electrical device 15 does not necessarily have to be an AC switch and can be any electrical device having terminals, such as an electrical outlet or multipole switch.

Figure 6:
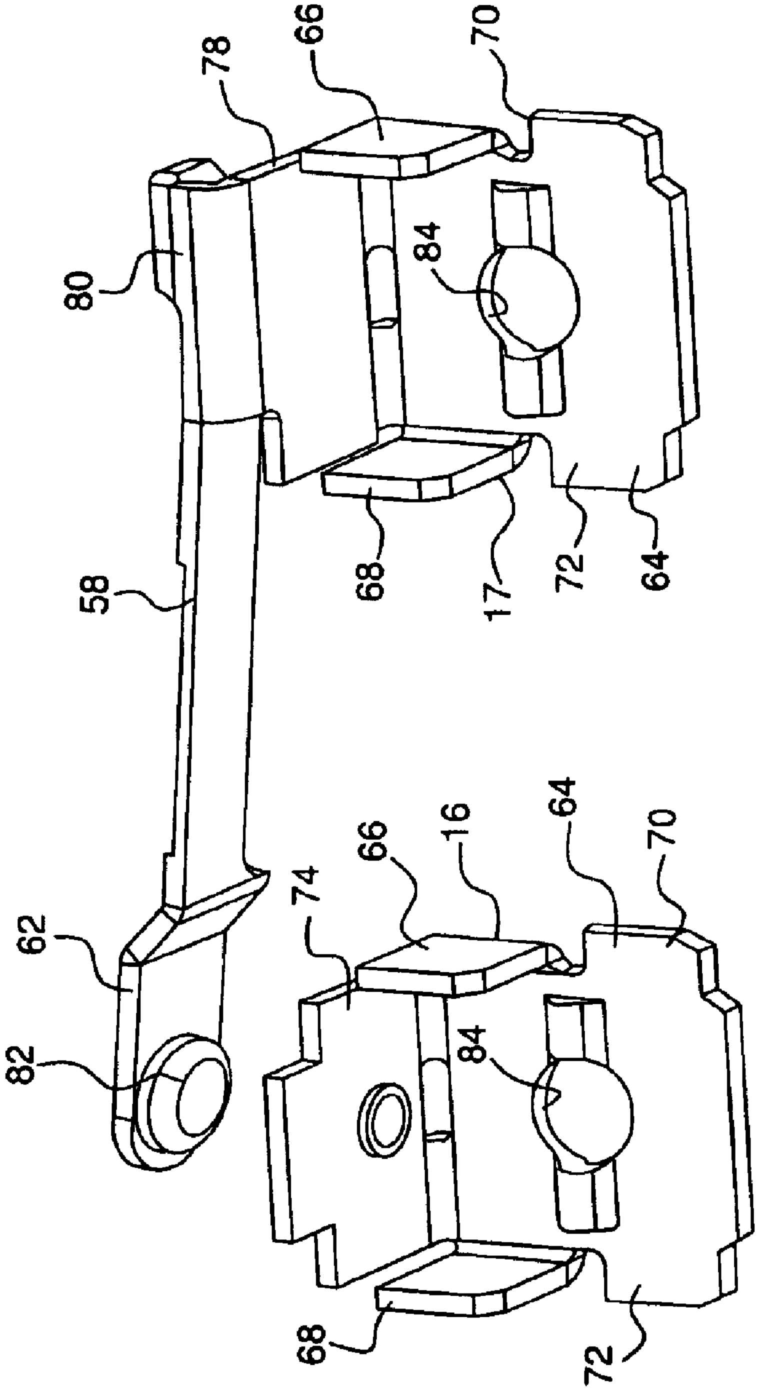
FIG. 6 is a perspective bottom view of the backwire terminals for the electrical device of FIG. 3, showing the backwire terminals without the clamping nuts.

As seen in FIG. 6, each terminal 16 and 17 has a substantially rectangular base 64 and is formed of metal, or any other electrically conductive material desired. Extending substantially transverse or perpendicular to the base and integrally or unitarily formed therewith are two wings or protrusions 66 and 68. Each wing or extension 66 and 68 extends from base 64 at opposite side of the rectangle and substantially parallel to each other wing. Protrusions 66 and 68 are substantially rectangular and extend from the upper portion of the base 64. Preferably, as seen in FIG. 4, the wings 66 and 68 extend toward the cavity formed by housing portions 12 and 14. Two substantially rectangular protrusions 70 and 72 extend outwardly and in the same plane as base 64.

Figure 8:
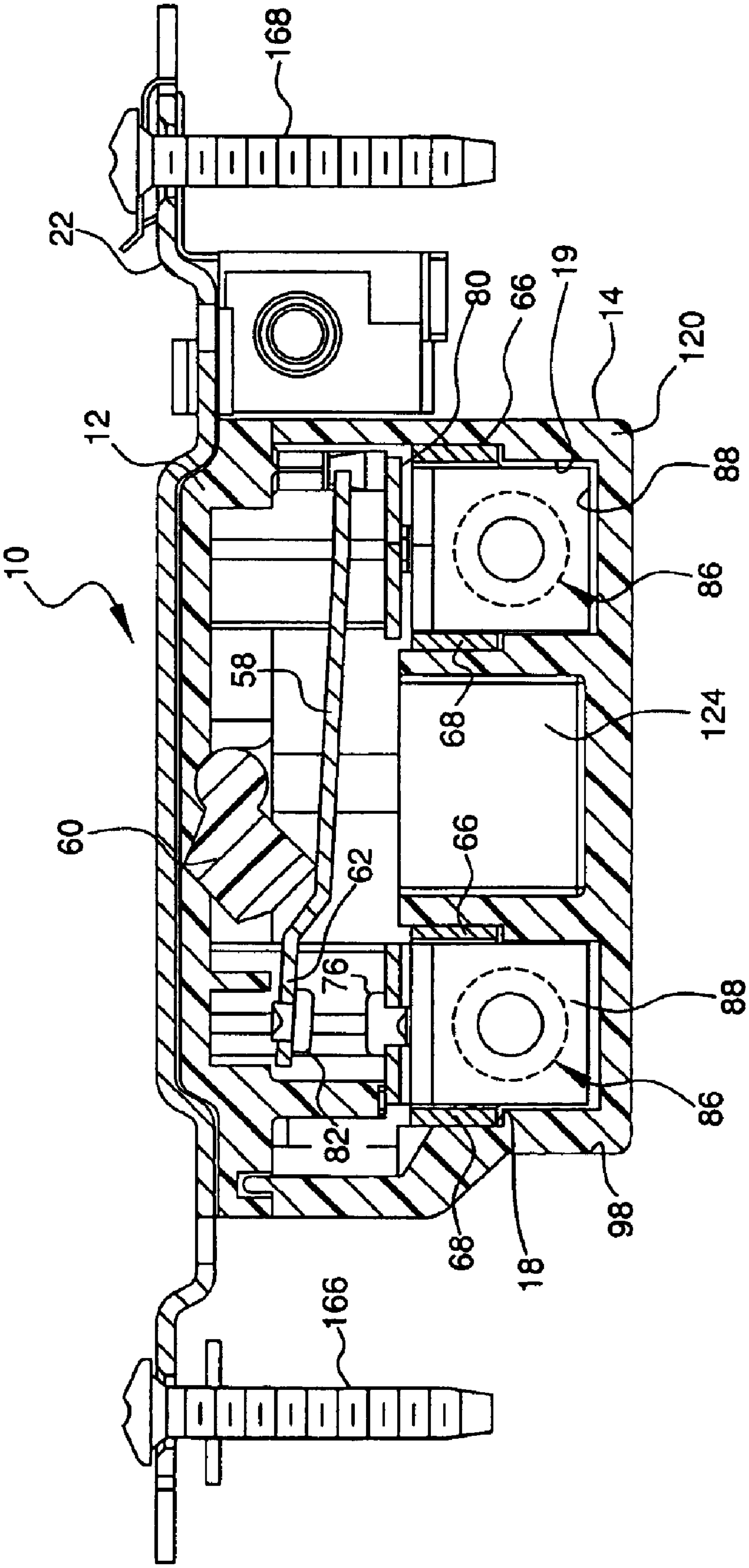
FIG. 8 is an elevational side view in section of the electrical device of FIG. 5 taken along lines 8—8, without the clamping nuts tightened against the backwire terminals.

Terminal 16 has a protrusion or tab 74 extending outwardly and substantially perpendicularly from the top of the base 64, between the wings 66 and 68. Tab 74 has a rounded protrusion 76 (FIG. 8) extending therefrom for contacting end 62 of arm 58.

Terminal 17, as described above, has an arm 58 that extends from substantially rectangular surface 78. Surface 78 is similar to tab 74 in that it extends substantially perpendicularly from the top of the base 64, between the wings 66 and 68. Arm 58 is a unitary or integral part of tab 78 and is formed from a connecting portion 80 that has a U-shaped cross section that wraps around and back over surface 78, so that arm 58 extends over surface 78. End 62 of arm 58 has a substantially rounded protrusion 82 that is aligned with protrusion 76 and facilitates contact between the two terminals 16 and 17.

Each base 64 of the terminals 16 and 17 has a threaded opening or aperture that accepts a screw 86 (FIG. 8) and allows clamping nut 88 to be coupled to the terminals. Each screw 86 is a conventional screw sized and configured to fit within the openings 84 and engage the nuts 88 with the head of the screw without extending too far into the electrical assembly.

Figure 7:
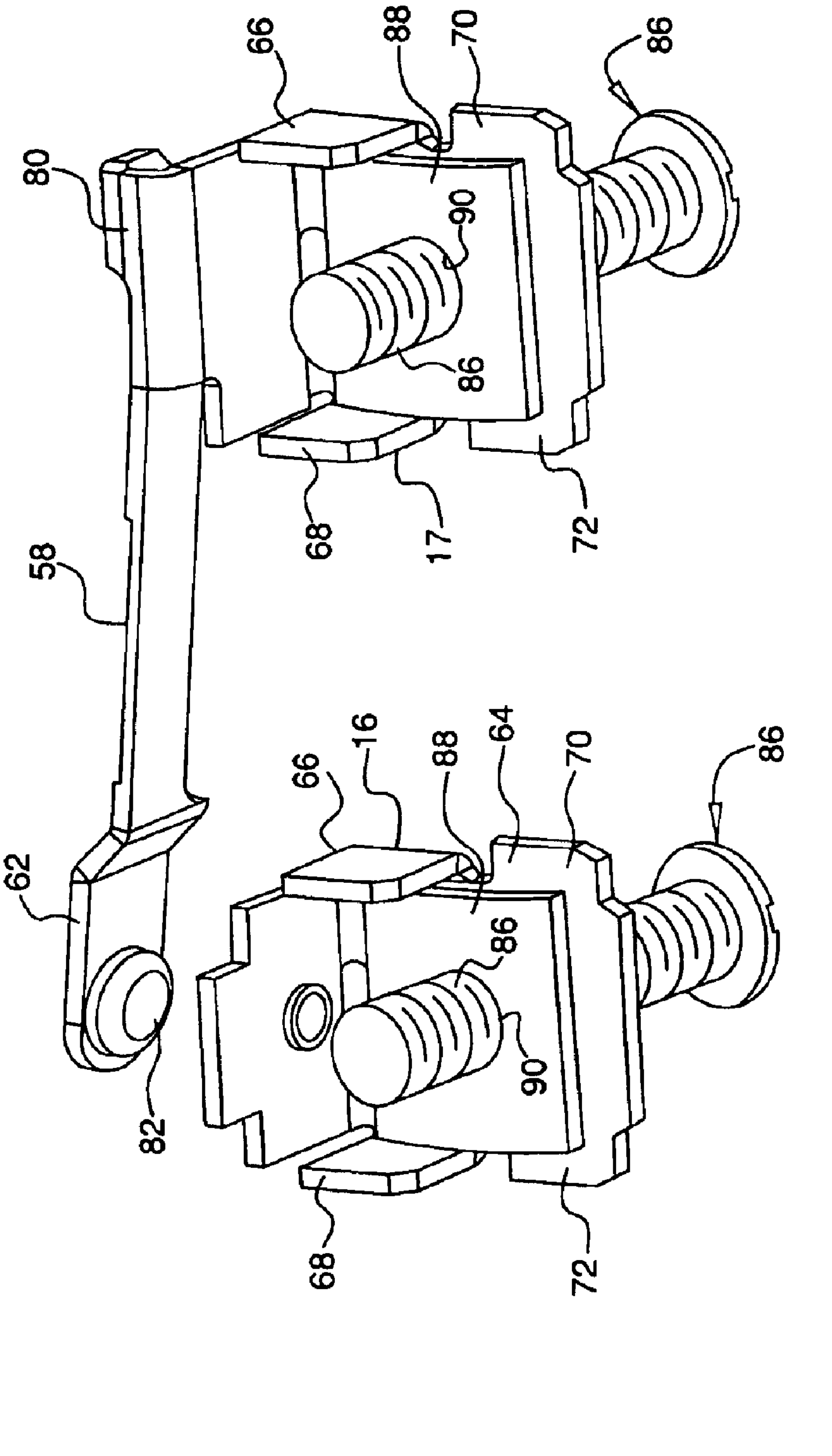
FIG. 7 is a perspective bottom view of the backwire terminals for the electrical device of FIG. 6, with the clamping nuts adjacent the backwire terminals.

As seen in FIG. 7, each nut 88 is substantially rectangular and is formed of metal or any other electrically conductive material desired. Extending through about the center of each nut 88 is an aperture or opening 90 that allows screws 86 to pass therethrough.

As seen in FIG. 4, housing portion 14 is a substantially rectangular, preferably plastic housing portion. Housing portion 14 has a substantially rectangular bottom surface or face 92. End walls 94 and 96 extend substantially perpendicular from the first and second ends 98 and 99 respectively. End wall 99 has an indentation 120 that is aligned with notch 36 on housing portion 12 and allows for placement of grounding tab 38.

Substantially rectangular walls 122 and 124 extend from approximately the center of a respective side on housing portion 14. Each wall has a hoop portion 126 and 128, respectively, extending outwardly from the outer surface of each wall. Each hoop portion defines a substantially rectangular through passageway 130 and is sized and configured to receive the barb 48 and post 46 on housing portion 12.

A lower wall 131 extends between wall 126 and walls 94 and 96. This lower wall is aligned with the walls of housing portion 12 to enclose the switch 16 on that side of housing portion 14.

Wall 124 and walls 94 and 96 form openings 98 and 99, respectively, in housing portion 14, these openings being substantially U-shaped. However, when housing portion 14 is coupled to housing portion 12, protrusions 42 and 44 align with openings 98 and 99 and form substantially rectangular openings which allow access into the internal portion of the housing or a cavity defined by the housing.

Yoke 22 is preferably a metal grounding strip as is known in the art. Yoke 22 has a substantially rectangular portion 132 with a substantially rectangular opening 134 therein.

Opening 134 overlies opening 26 in the housing portion 12 and allows toggle handle 50 to extend therethrough. Unitary with yoke 22, at first and second ends 136 and 138, are substantially rectangular recessed surfaces 140 and 142, respectively. Each surface 140 and 142 has an opening or aperture 144 and 146, respectively, therein that receives fasteners 32 and 34, respectively, coupling the yoke 22 to the housing portion 12 and the housing portions together. If desired, the fasteners can be rivots. Surface 142 has grounding tab 38 coupled thereto. Grounding tab 38 extends substantially perpendicular from surface 142 and in substantially the same direction as the recessed surfaces. Grounding tab 38 is generally rectangular and has an aperture 148 therein for receiving a fastener or screw 150.

The grounding tab 38 preferably is used for backwiring a grounding lead by coupling a wire or electrical conductor to tab 38 by frictionally holding the wire between clamping member 152 and tab 38. Clamping member 152 preferably has an aperture 154 therein for receiving screw 150. As is known in the art, the screw 150 passes through opening 154 and into opening 148. By threading the screw into opening 148, clamping member 152 is forced toward tab 38, thereby compressing an electrical wire therebetween. Clamping member 152 preferably has a tab 156 on one side that extends substantially perpendicularly to the clamping member and prevents the clamping member from rotating relative to the grounding tab 38.

Connecting tabs 158 and 160 extend adjacent surfaces 140 and 142, respectively. Each tab 158 and 160 has openings 162 and 164 therein, for receiving fasteners or screws 166 and 168, respectively, thereby coupling the electrical assembly 10 to an electrical box or any other fixture desired. Preferably, a U-shaped grounding spring 169 is placed around tab 160 for grounding the electrical device to a metal box (not shown) that the device is preferably coupled to, as is known in the art. Screw 168 passes through opening 167 to couple the grounding spring to tab 160. Furthermore, each tab 158 and 160 has two generally circular projections 170 and 172 and 174 and 176, respectively, extending therefrom to couple to any device desired, each projection having an opening or aperture therein.

Assembly

As seen in FIG. 4, switch 15 is assembled in housing portion 14. The switch is assembled as is known in the art, and terminals 16 and 17 are aligned so that they are accessible through openings 98 and 99, respectively. Terminals 16 and 17 are sized and configured to fill openings 98 and 99, respectively. Each terminal has protrusions 70 and 72 that extend beyond a respective opening, assisting in maintaining the terminals in the appropriate position, i.e. the terminals are prevented from passing from the internal portion of the housing through the openings and out of the housing or protruding through the openings. Furthermore, the base of each terminal preferably extends in a direction that is generally parallel to at least a portion of wall 124 and end walls 94 and 96 and walls 42 and 46 on housing portion 12.

Additionally wings 66 and 68 extend adjacent a respective wall and into the opening toward the interior of the housing. For example, wings 66 and 68 of terminal 16 extend adjacent walls 94 and 124, respectively.

Openings 98 and 99 are spaced so that the terminals can electrically couple when toggle handle 50 is moved into the closed position. In other words, the openings are spaced so that arm protrusion 82 on arm 58 contacts protrusion 76 on terminal 16 when the toggle handle is moved into the closed position, thereby completing the electrical circuit.

Operation

Once switch 15 is assembled in housing portion 14, as is known in the art, housing portion 12 is coupled to housing portion 14. Toggle handle 50 extends through opening 26 and protrusions 42 and 44 slide into place with openings 98 and 99, respectively. Each barb on housing portion 12 couples to a respective hoop portion on housing portion 14. For example, barb 48 on post 46 enters opening 130 in hoop portion 128, expanding hoop portion outwardly. After the barb passes through opening 130, the barb engages the end of the hoop portion, locking the two housing portions together.

Screws 32 and 34 are then passed through openings 144 and 146, respectively, in the yoke 22 and into the housing portion 12 and housing portion 14, coupling the yoke to the housing portion and securing the two housing portions together.

Clamping nuts 88 are then aligned between the base 70 of each terminal and the internal switch, the clamping nuts being positioned between each wing 66 and 68. A screw 86 is passed through the opening 84 in the base of each terminal and into a respective opening 90 in each nut 88. It is noted that clamping nuts 88 can be positioned relative to the terminals at any time prior to coupling the wire to the terminals and do not need to be assembled in this specific manner.

An electrical wire, such as wires 108, are inserted between clamping nut 88 and the base 64 of each terminal to conduct electricity through the switch. Using a screw driver or any other tool or even rotating the screws by hand, the screws 86 are tightened, so that the screw pulls the clamping nut and forces it towards and against the base, thereby frictional clamping the wire 108 between the clamping nut and the base of the terminal.

As the screws 86 rotate, they will frictionally engage the clamping nut, attempting to twist or rotate the clamping nut relative to the terminal. However, as seen in FIG. 9, each nut will engage or contact a wing (66 or 68, depending on the rotation of the nut), thereby substantially preventing or limiting relative rotation of the clamping nut 88 relative to a respective terminal. Furthermore, the wings prevent the clamping nut from engaging the housing 14 and forcing a portion of the housing 14 away from the housing 12. Therefore, the wings will prevent the terminals from moving out of position. As described above, it is necessary that the openings 98 and 99 be spaced properly to allow contact between the terminals 16 and 17. If however, the clamping nut contacts a wall, such as walls 94 or 96, the openings 98 or 99 may change in shape or size, moving the terminals and therefore the contacts, which then may not line up or make proper contact as intended by design. More specifically, if one or both of the openings 98 or 99 change in shape or size, one or both of the terminals 16 or 17 can move. If this movement occurs, protrusion 82 on arm 58 may not properly contact protrusion 76 on terminal 16, resulting in adverse performance of the electrical device.

The use of top, bottom, inward and outward refer to relative directions depending on the orientation of the components in the electrical assembly, and do not limit the electrical assembly to any specific orientation.

While an advantageous embodiment has been chosen to illustrate the invention, it will be understood by those skilled in the art that various changes and modifications can be made therein without departing from the scope of the invention as defined in the appended claims.

What is claimed is:

1. An electrical receptacle, comprising:

a first housing portion;

a second housing portion coupled to said first housing portion;

an electrical device positioned between said first and second housing portions;

an electrical terminal connected to said electrical device, said terminal having a base and a first protrusion and a second protrusion extending transverse to and integrally from said base, said first and second protrusions being on opposite sides of said terminal;

a clamp located adjacent to said terminal base and positioned between said first and second protrusions and adapted to couple an electrical wire between said clamp and said terminal, said clamp having a first planar side edge and a second planar side edge parallel to said first planar side edge and being separable from said protrusions; and a fastening device extending through and threadedly engaged with said clamp and adapted to rotate relative to said terminal;

wherein at least one of said first and second planar side edges of said clamp engages at least one of said first and second protrusions on said terminal base to limit rotation of said clamp relative to said terminal.

2. An electrical receptacle according to claim 1, wherein said terminal is positioned adjacent said second housing portion with said first and second protrusions between said second housing portion and said clamp, thereby preventing said clamp from contacting said second housing portion, and thereby preventing said second housing portion from separating and deforming said first housing portion.

3. An electrical receptacle according to claim 1, wherein said clamp is substantially rectangular.

4. An electrical receptacle according to claim 1, wherein an opening is formed through the first and second housing portions, said opening is substantially rectangular with four walls and said first and second protrusions prevent said clamp from contacting at least two of said four walls.

5. An electrical receptacle according to claim 4, wherein at least three of said four walls are formed by said second housing portion.

6. An electrical receptacle according to claim 1, wherein said electrical device is an AC switch.

7. An electrical receptacle according to claim 1, wherein said first and second protrusions extend inwardly and toward said electrical device.

8. An electrical receptacle according to claim 1, wherein said first and second protrusions extend substantially perpendicular to said first and second substantially planar surfaces of said clamp.

9. An electrical receptacle according to claim 1, wherein said electrical terminal includes a tab integral with said base, said tab extending substantially perpendicular from said base.

10. An electrical receptacle according to claim 9, wherein said tab and said first and second protrusions extend in the same direction from said base; and wherein said clamp includes a third planar side edge adjacent said tab, said third planar side edge of said clamp being substantially perpendicular to said first and second side edges.

11. An electrical receptacle according to claim 1, wherein said first and second protrusions are substantially planar and have a length less than a length of said base.

12. An electrical receptacle according to claim 1, wherein said clamp is separable from said protrusions.

13. An electrical wiring device, comprising:

a housing cover having a front surface and a first wall extending substantially perpendicular from said front surface;

a housing backing coupled to said housing cover, said housing backing having a rear surface and first and second side surfaces extending substantially perpendicular from said rear surface, said first wall and said first and second side surfaces forming an opening in said housing backing;

an electrical a terminal accessible through said opening and being connected to an electrical device within said electrical wiring device, said terminal having a tab, a base integral with said tab and extending perpendicular to said tab, and first and second protrusions extending substantially perpendicularly from said base and where said protrusions are perpendicular to said tab, each of said first and second protrusions having an inner surface, said first and second protrusions being positioned adjacent said first and second side surfaces, respectively, and extending outwardly with respect to said opening in said backing cover;

a fastening device engaging said terminal; and a clamp adjacent said terminal base and engaging said fastening device for coupling an electrical wire to said electrical device between said clamp and said base of said terminal, said clamp being prevented from contacting at least one of said first and second surfaces by engaging at least one of said inner surfaces of said first and second protrusions on said terminal and no other surfaces of said first and second protrusions.

14. An electrical wiring device according to claim 13, wherein said base is substantially rectangular and said first and second protrusions extend from opposite sides of said base.

15. An electrical wiring device according to claim 14, wherein said clamp is substantially rectangular and is positioned adjacent said base between said first and second protrusions.

16. An electrical wiring device according to claim 13, wherein said first and second protrusions extend inwardly and toward said electrical device.

17. An electrical wiring device according to claim 13, wherein said clamp has first and second substantially planar surfaces, and said first and second planar surfaces are substantially parallel to one another, and third and fourth substantially planar surfaces that are parallel to each other and perpendicular to said first and second surfaces.

18. An electrical wiring device according to claim 17, wherein said first and second protrusions extend substantially perpendicular to said first and second substantially planar surfaces of said clamp.

19. An electrical wiring device according to claim 13, wherein said opening is substantially rectangular with four walls and said first and second protrusions prevent said clamp from contacting at least two of said four walls.

20. An electrical wiring device according to claim 19, wherein at least three of said four walls are formed by said housing backing.

21. A receptacle housing for an electrical device, comprising:

a first portion having a front surface and a partition extending around the periphery of the front surface;

a second portion having a rear surface and a first wall and a second wall, said first and second portions being coupled together and forming a cavity therebetween, said first wall, said second wall and said partition of said first portion forming an opening through said housing and into said cavity;

an electrical terminal in said cavity and accessible through said opening, said terminal having a base extending in a direction that is generally parallel to said first and second walls and having at least one wing extending away from said cavity transverse to said base, said at least one wing being integral with said base and having a length less than a length of a side edge of said base;

a screw engaging said terminal;

a substantially planar clamp separable from said terminal and being coupled to said terminal using said screw, said screw extending through said terminal and into said clamp, said clamp being positioned adjacent and proximal to said first and second walls, said clamp having first and second planar opposite side edges with a length of said base; and a wire that extends between said clamp and said base of said terminal;

wherein said clamp is coupled to said terminal by rotating said screw and said clamp is substantially prevented from rotating with said screw relative to said terminal and said first and second walls by a side edge of said clamp engaging said at least one wing, thereby preventing the clamp from contacting at least one of said first and second walls, said clamp being freely movable in a direction substantially transverse to said base of said terminal relative to said at least one wing.

22. A receptacle housing for an electrical device according to claim 21, wherein said base has at least two wings extending away from said cavity transverse to said base, said at least two wings being on opposite sides of said base.

23. A receptacle housing for an electrical device according to claim 22, wherein said clamp is positioned between said at least two wings, said at least two wings thereby preventing said clamp from contacting either of said first and second walls.

24. An electrical receptacle, comprising:

a first housing portion;

a second housing portion coupled to said first housing portion;

an electrical device positioned between said first and second housing portions;

an electrical terminal connected to said electrical device, said terminal having a planar tab, a base extending transverse to said tab and being integral with said tab, and a protrusion extending transverse to and integrally from said base, said protrusion being substantially perpendicular to said tab;

a clamp located adjacent to said tab and said protrusion and adapted to couple an electrical wire to said terminal between said clamp and said base; and a fastening device extending through and threadedly engaged with said clamp and adapted to rotate relative to said terminal;

wherein said clamp engages said protrusion on said terminal to limit rotation of said clamp relative to said terminal.

25. An electrical receptacle according to claim 24, wherein said protrusion has a length less than a length of said base.

26. An electrical receptacle according to claim 25, wherein said protrusion has a length less than a length of a side edge of said clamp and where said protrusion is contiguous with a corner of said base.

* * * * *